United States Patent
Smith et al.

(10) Patent No.: US 6,751,147 B1
(45) Date of Patent: Jun. 15, 2004

(54) METHOD FOR ADAPTIVELY WRITING A MAGNETIC RANDOM ACCESS MEMORY

(75) Inventors: Kenneth K. Smith, Boise, ID (US); Frederick A. Perner, Palo Alto, CA (US); Richard L. Hilton, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/635,399

(22) Filed: Aug. 5, 2003

(51) Int. Cl.[7] .............................................. G11C 11/15
(52) U.S. Cl. .................... 365/225.5; 365/173; 365/171; 365/228; 365/230.03
(58) Field of Search ................................ 365/171, 173, 365/158, 225.5, 228, 230.03, 243.5

(56) References Cited

U.S. PATENT DOCUMENTS

| | | | |
|---|---|---|---|
| 5,982,660 A | 11/1999 | Bhattacharyya et al. | 365/173 |
| 6,052,302 A | 4/2000 | Moyer et al. | 365/173 |
| 6,081,445 A | 6/2000 | Shi et al. | 365/158 |
| 6,097,625 A | 8/2000 | Scheuerlein | 365/171 |
| 6,134,139 A | 10/2000 | Bhattacharyya et al. | 365/171 |
| 6,185,143 B1 | 2/2001 | Perner et al. | 365/210 |
| 6,236,590 B1 | 5/2001 | Bhattacharyya et al. | 365/173 |
| 6,335,890 B1 | 1/2002 | Reohr et al. | 365/225.5 |
| 6,368,878 B1 | 4/2002 | Abraham et al. | 438/3 |
| 6,404,671 B1 | 6/2002 | Reohr et al. | 365/158 |
| 6,456,524 B1 | 9/2002 | Perner et al. | 365/158 |
| 6,456,525 B1 | 9/2002 | Perner et al. | 365/171 |
| 6,490,217 B1 | 12/2002 | DeBrosse et al. | 365/225.5 |
| 6,509,621 B2 | 1/2003 | Nakao | 257/421 |
| 6,510,080 B1 | 1/2003 | Farrar | 365/171 |
| 6,522,577 B1 | 2/2003 | Earl et al. | 365/158 |
| 6,606,262 B2 * | 8/2003 | Perner | 365/158 |

* cited by examiner

Primary Examiner—Andrew Q. Tran (57) ABSTRACT

A method of adaptively writing magnetic memory cells of a MRAM is disclosed according to an embodiment of the present invention. The method comprises providing a logical data block of a memory array having magnetic memory cells, each magnetic memory cell in a known initial state and each magnetic memory cell configured along an easy-axis magnetic field generating conductor and writing to the magnetic memory cells using a predefined minimum current level. The method may further comprise sensing the magnetic memory cells to determine if data has been successfully written, incrementing the current level if writing was unsuccessful and repeating above.

19 Claims, 12 Drawing Sheets

METHOD FOR ADAPTIVELY WRITING A MAGNETIC RANDOM ACCESS MEMORY

CROSS-REFERENCE TO RELATED APPLICATIONS

This patent application is related to simultaneously filed patent applications titled: LOGICAL DATA BLOCK, MAGNETIC RANDOM ACCESS MEMORY, MEMORY MODULE, COMPUTER SYSTEM AND METHOD, Ser. No. 10/635,150 and METHOD, APPARATUS AND SYSTEM FOR ERASING AND WRITING A MAGNETIC RANDOM ACCESS MEMORY, Ser. No. 10/635,405, both copending.

BACKGROUND OF THE INVENTION

A magnetic memory such as a MRAM typically includes an array of magnetic memory cells. A typical magnetic memory cell includes a layer of magnetic film in which magnetization is alterable and a layer of magnetic film in which magnetization is fixed or "pinned" in a particular direction. The magnetic film having alterable magnetization may be referred to as a data storage layer. The magnetic film that is pinned may be referred to as a reference layer.

Figure 1A:
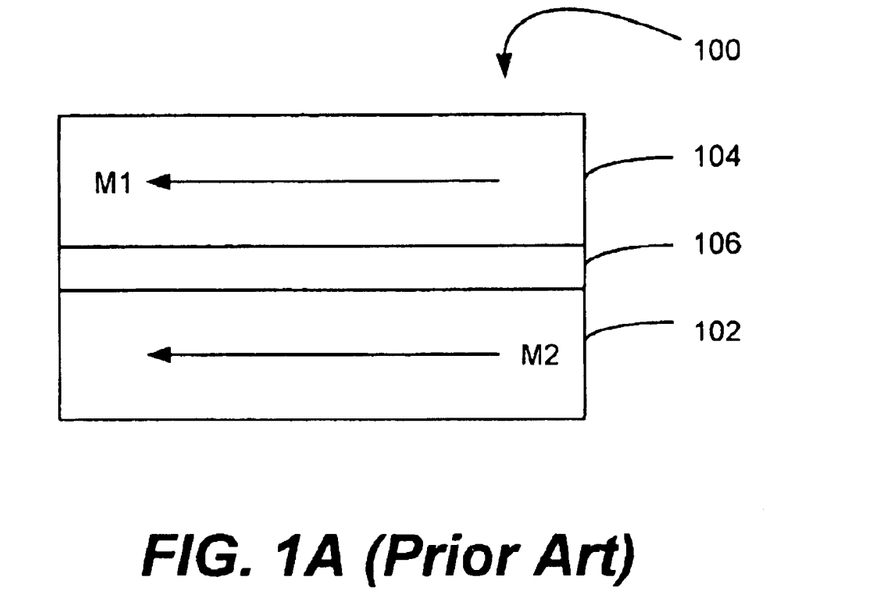
FIGS. 1A–1B illustrate the basic structure of a conventional magnetic memory cell showing both the parallel and anti-parallel magnetic orientations, respectively.
Figure 1B:
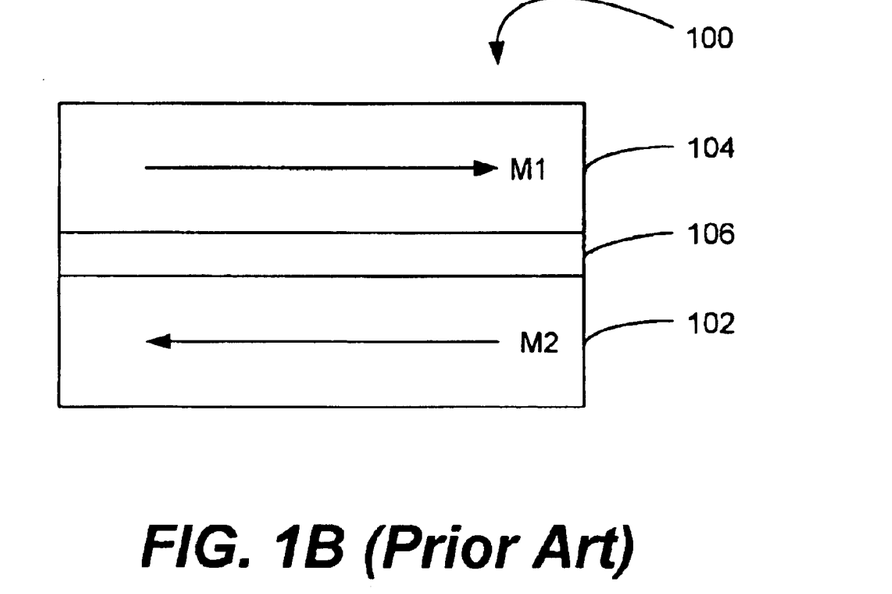

The orientation of magnetization of each magnetic memory cell may assume one of two stable orientations at any given time. These two stable orientations, are referred to as "parallel" and "anti-parallel", and representing logic states of "1" and "0,", respectively. FIGS. 1A and 1B illustrate the basic structure of a conventional magnetic memory cell 100 having a reference layer 102 with a same-axis orientation of magnetization with respect to the easy-axis of the data storage layer 104. The magnetic memory cell 100 includes a tunnel barrier 106 between the data storage layer 104 and the reference layer 102. This structure of the magnetic memory cell 100 may be referred to as a spin tunneling device (STD) in that electrical charge migrates through the tunnel barrier 106 during read operations. This electrical charge migration through the tunnel barrier 106 is due to a phenomenon known as spin tunneling and occurs when a read voltage is applied to the magnetic memory cell 100.

FIG. 1A illustrates a magnetic memory cell 100 having a data storage layer 104 with parallel magnetic orientation relative to the reference layer 102. Vector M1 represents the overall or resulting orientation of magnetization in the data storage layer 104. Vector M1 includes contributions from magnetizations along the easy-axis and in the edge domains of the data storage layer 104. The orientation of magnetization in the reference layer 102 is represented by a vector M2 that is fixed in a direction parallel to the easy-axis of the data storage layer 104. Thus, FIG. 11A is representative of a magnetic memory cell storing a logical "1" state.

Vector M1 may be changed depending upon the logic state of the magnetic memory cell 100. Vector M1 is manipulated by the application of magnetic fields using conductors associated with the magnetic memory cell 100. These magnetic fields are applied to flip or reverse the directions of the magnetizations, vector M1, in the data storage layer 104 including the easy-axis magnetization and the edge domains. FIG. 1B illustrates a magnetic memory cell 100 having a reference layer 102 with anti-parallel magnetic orientation relative to the reference layer 102. Thus, FIG. 1B is representative of a magnetic memory cell storing a logical "0" state.

The logic state of a magnetic memory cell may be indicated by its resistance, which depends on the relative orientations of magnetization in its data storage and reference layers. Such a magnetic memory cell is typically in a low resistance state if the orientation of magnetization in its data storage layer is substantially parallel to the orientation of magnetization in its reference layer. In contrast, a magnetic memory cell is typically in a high resistance state if the orientation of magnetization in its data storage layer is substantially anti-parallel to the orientation of magnetization in its reference layer.

A magnetic memory cell may be written to a desired logic state by applying magnetic fields that rotate the orientation of magnetization in its data storage layer. Typically, the orientation of magnetization in the data storage layer aligns along an axis of the data storage layer that is commonly referred to as an "easy-axis." The magnetic fields may be applied to flip the orientation of magnetization in the data storage layer along its easy-axis to either a parallel or anti-parallel orientation with respect to the orientation of magnetization in the reference layer depending on the desired logic state.

Prior magnetic memories typically include an array of word lines and bit lines that are used to apply magnetic fields to the magnetic memory cells during writing. The magnetic memory cells are usually located at intersections of the word lines and bit lines. A selected magnetic memory cell may be written by applying electrical currents to the particular word and bit lines that intersect at the selected magnetic memory cell. Typically, an electrical current applied to the particular bit line generates a magnetic field substantially aligned along the easy-axis of the selected magnetic memory cell. The magnetic field aligned to the easy-axis may be referred to as a longitudinal write field. An electrical current applied to the particular word line usually generates a magnetic field substantially perpendicular to the easy-axis of the selected magnetic memory cell.

Typically, only the selected magnetic memory cell receives both the longitudinal and the perpendicular write fields. Other magnetic memory cells coupled to the particular word line usually receive only the perpendicular write field. Other magnetic memory cells coupled to the particular bit line usually receive only the longitudinal write field.

The magnitudes of the longitudinal and the perpendicular write fields are usually chosen to be high enough so that the selected magnetic memory cell switches its logic state, but low enough so that the other magnetic memory cells which are subject to either the longitudinal or the perpendicular write field do not switch. An undesirable switching of a magnetic memory cell that receives only the longitudinal or the perpendicular write field is commonly referred to as "half-select" switching.

Manufacturing variation among the magnetic memory cells may increase the likelihood of half-select switching. For example, manufacturing variation in the longitudinal or perpendicular dimensions or shapes of the magnetic memory cells may increase the likelihood of half-select switching. In addition, variation in the thicknesses or the crystalline anisotropy of data storage layers may increase the likelihood of half-select switching. Unfortunately, such manufacturing variation decreases the yield in manufacturing processes for magnetic memories and reduces the reliability of prior magnetic memories.

The reference layer of a magnetic memory cell is usually a layer of magnetic material in which magnetization is fixed or "pinned" in a particular direction. In a conventional magnetic memory cell, the reference layer may be formed with its magnetization pinned in a direction that is parallel to the easy-axis of the data storage layer. As a consequence, the orientation of magnetization in the reference layer of the conventional magnetic memory cell is typically parallel to the easy-axis of the data storage layer.

A conventional magnetic memory cell may be written by applying magnetic fields that reverse the orientation of magnetization in the data storage layer from one direction to the other along its easy-axis. This reversal causes the magnetic memory cell to switch between its high and low resistance states. The logic state of the magnetic memory cell may be determined during a read operation by measuring its resistance.

Typically, the data storage layer is fabricated as a rectangle or oval with an elongated dimension along its easy-axis. These configurations minimize the negative effects of edge domains. Such a structure usually increases easy-axis contribution to the resulting orientation of magnetization in the data storage layer in comparison to contributions from the edge domains. The rectangular or oval configuration sets the shape anisotropy for the bit cell, thereby and providing a bi-stable structure. The parallel state requires more energy to flip the orientation of magnetization in the data storage layer during write operations.

Further, the memory cells are aligned so that the easy axes are parallel with their respective word lines. One problem with this configuration is that during a write operation, the memory cells not actually being written, but which share the same bit line, are in a half-select mode. During half-select, a write current can generate a magnetic field sufficient enough for certain susceptible bits to cause the magnetic orientation of data storage layer to reverse from a parallel orientation to a low-energy state or anti-parallel orientation. If the orientation was originally in a parallel orientation and then is flipped to be anti-parallel, an error will have occurred. Error correction techniques may correct some of these occurrences, but when the occurrences exceed the ability of the error correction techniques, uncorrectable errors will result. This same form of half-select error can occur during a read operation where the word line is held to a given potential value, typically ground, and a sense or read potential is applied to all of the columns. While the generated read current for a given bit is typically small (on the order of 1 $\mu$A or less) and all of the bits on a selected row have this same current flow out the row, the net current can be enough to half-select those memory cells sharing the word line if the word line is oriented to generate easy-axis field, even though they are not presently being read.

Further, as the dimensions of the memory cells continue to decrease, their susceptibility to half-select-induced errors increases. Accordingly, there exists a need in the art for a method of adaptively writing a magnetic random access memory configured for reducing half-select errors.

SUMMARY OF THE INVENTION

A method of adaptively writing magnetic memory cells of a MRAM is disclosed according to an embodiment of the present invention. The method comprises providing a logical data block of a memory array having magnetic memory cells, each magnetic memory cell in a known initial state and each magnetic memory cell configured along an easy-axis magnetic field generating conductor and writing to the magnetic memory cells using a predefined minimum current level. The method further comprises sensing the magnetic memory cells to determine if data has been successfully written, incrementing the current level if writing was unsuccessful and repeating. The method further comprises recording current level if writing was successful.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

The following drawings illustrate exemplary embodiments for carrying out the invention. Like reference numerals refer to like parts in different views or embodiments of the present invention in the drawings.

DETAILED DESCRIPTION

Figure 2:
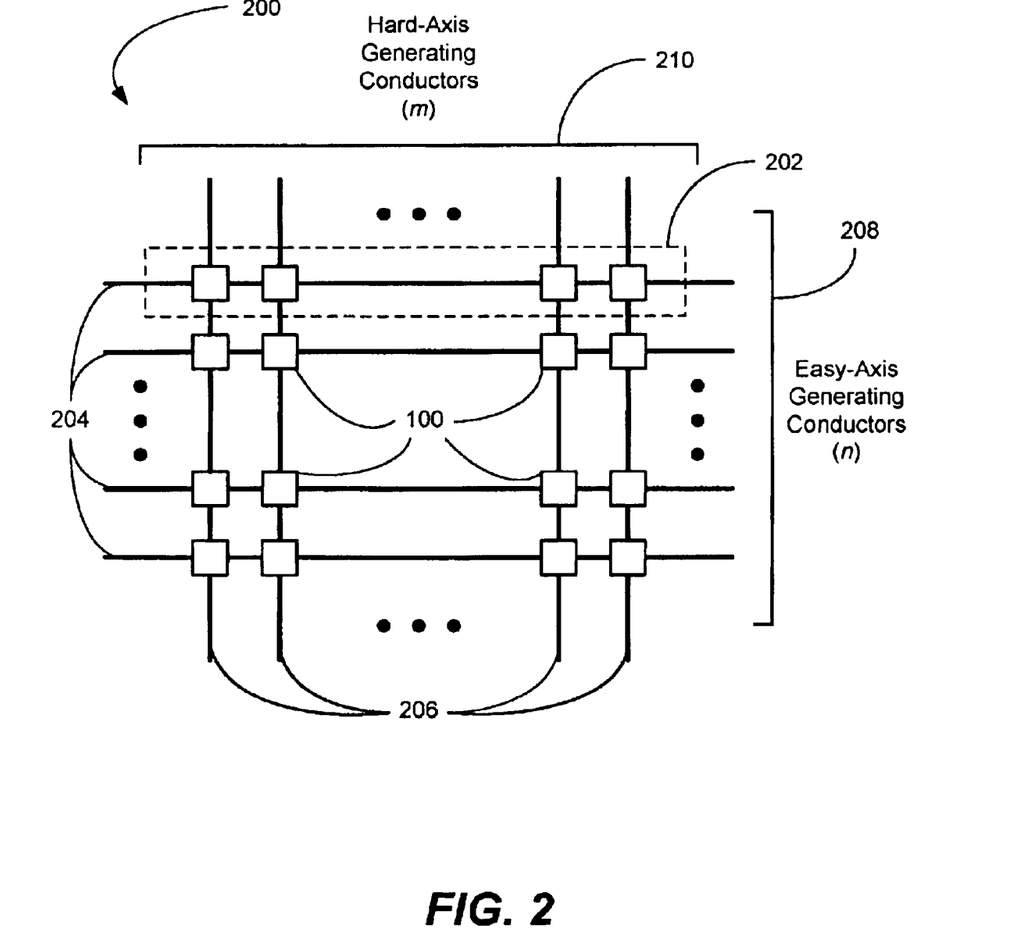
FIG. 2 is a schematic block diagram of an embodiment of a MRAM in accordance with the present invention.

Reference will now be made to the exemplary embodiments illustrated in the drawings, and specific language will be used herein to describe the same. FIG. 2 is a schematic block diagram of an embodiment of a MRAM 200 in accordance with the present invention. MRAM 200 may include a plurality of easy-axis generating conductors 208 (the plurality represented by the number n as shown in FIG. 2) and a plurality of hard-axis generating conductors 210 (the plurality represented by the number m as shown in FIG. 2). MRAM 200 may include one or more logical data blocks 202 (only one shown in dotted line for clarity) each logical data block 202 including a plurality of magnetic memory cells 100 in communication with a single easy-axis conductor 204. The magnetic memory cells 100 are formed at the intersections of a single easy-axis conductor 204 and each intersecting hard-axis conductor 206. A logical data block 202 according to embodiment of the present invention is sized according to a preselected, block-based error correction code (ECC) used to encode data within the logical data block 202.

Error correction coding involves receiving original data for storage in the magnetic memory cells 100 and forming ECC encoded data that allows errors to be identified and corrected. ECC encoded data includes the original data and ECC parity data. During a read operation, the original data may be recovered from corrupted ECC encoded data by ECC decoding the corrupted ECC encoded data. Preselected, block-based, error correction coding schemes suitable for use in embodiments of the present invention may include at least one of Bose-Chaudhuri-Hochquenghem (BCH) code, Reed-Solomon code and run length limited (RLL) code. For example, according to one embodiment of the present invention, a [160, 128, 32] Reed-Solomon code produces codewords of 160, 8-bit symbols corresponding to 128 original data bytes (8-bits) and is capable of correcting up to 16 random errors in the 160, 8-bit symbols. According to another embodiment of the present invention, a [132, 128, 4] Reed-Solomon code produces codewords of 132, 8-bit symbols corresponding to 128 original data bytes and is capable of correcting up to two random errors in the 132, 8-bit symbols. Other ECC schemes may also be utilized with embodiments of the present invention.

Additional background information on error correction coding schemes may be found in W. W. Peterson and E. J. Weldon, Jr., "Error-Correcting Codes", 2nd Edition, 12th Printing, 1994, MIT Press, Cambridge, Mass. Additional background information on Reed-Solomon codes may be found in "Reed-Solomon Codes And Their Applications", Ed. S. B. Wicker and V. K. Bhargava, IEEE Press, New York, 1994.

A logical data block 202 in accordance with an embodiment of the present invention may include a plurality of magnetic memory cells 100 formed at intersections of hard-axis generating conductors 210 and an easy-axis generating conductor 204, wherein the logical data block 202 includes a number m of magnetic memory cells 100 in communication with an easy-axis generating conductor 204. By placing all m magnetic memory cells 100 along a single easy-axis conductor 204 in a single logical data block 202, half-select errors are reduced or eliminated because selected data bits may be written using hard-axis generating conductors. The easy-axis generating conductor 204 may either be a row conductor or a column conductor according to other embodiments of the present invention.

Alternative embodiments according to the present invention may include memory cells 100 having either soft or pinned reference layers 102. In a soft reference layer 102, the direction of the magnetization is controlled by an applied magnetic field only during read operations. In a pinned reference layer 102, the direction of magnetization is fixed. Read and write operations of a memory cell 100 including a soft reference layer 102 are similar to a memory cell with a pinned reference layer 102. A pinned reference layer 102 may also referred to as a "hard reference layer" 102.

Figure 3:
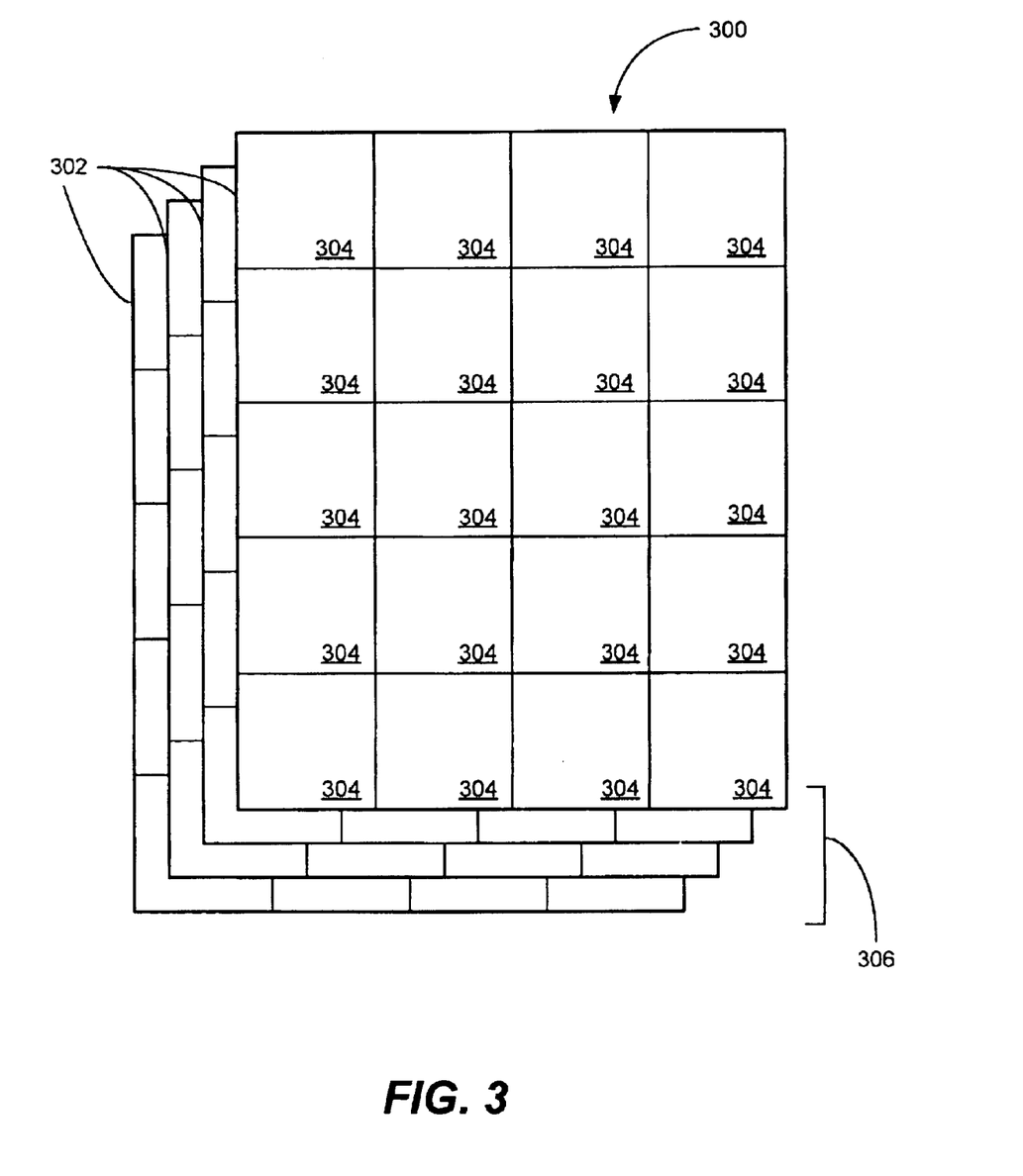
FIG. 3 illustrates an exploded perspective view of another embodiment of a MRAM according to the present invention.

FIG. 3 illustrates an exploded perspective view of a MRAM 300 according to another embodiment of the present invention. MRAM 300 may include one or more MRAM arrays 302, wherein each MRAM array 302 may include a plurality of MRAM sub-arrays 304. According to another embodiment of the present invention, an easy-axis generating conductor (not shown for clarity) may span a plurality of MRAM sub-arrays 304 and/or MRAM arrays 302. MRAM 300 may further include a stack 306 of LAM arrays 302 placed in parallel and on top of one another. The stack 306 may include interconnections between MRAM arrays 302 for corresponding row and column conductors using means known to one of ordinary skill in the art. The number of MRAM sub-arrays 304 in a MRAM array 302 may be selected for the memory size of a particular application or according to manufacturing process limitations. Similarly, the number of MRAM arrays 302 in a stack 306 may also be selected according to the desired memory size of a given application subject only to process or packaging limitations.

Another embodiment of a MRAM according to the present invention may include a plurality of logical data blocks, wherein each logical data block includes an easy-axis generating conductor, a plurality of hard-axis generating conductors and a plurality of magnetic memory cells formed at intersections of the easy-axis conductor and the plurality of hard-axis conductors. The logical data block may further be configured in size by a preselected, block-based ECC. According to embodiments of the present invention, the preselected, block-based ECC may include at least one of BCH code, Reed-Solomon code and RLL code as described above.

According to embodiments of the present invention, an easy-axis conductor may be a row or column conductor. According to other embodiments of the present invention, an easy-axis conductor may be a write line or a bit line. Similarly, according to other embodiments of the present invention, a hard-axis conductor may be a row or column conductor. According to further embodiments of the present invention, a hard-axis conductor may be a write line or a bit line.

Embodiments of magnetic memory cells may include giant magnetoresistance (GMR) devices, tunneling magnetoresistance (TMR) with magnetic tunnel junction (MTJ) devices, diode-isolated MTJ devices, transistor-isolated MTJ devices, Hall effect storage devices, ballistic tunneling devices and any other suitable form of magnetic memory cell according to embodiments of the present invention.

An embodiment of a magnetic memory module according to the present invention is disclosed. The magnetic memory module may include at least one MRAM. The MRAM may include at least one logical data block including a plurality of magnetic memory cells. The at least one logical data block may further include an easy-axis conductor configured for generating an easy-axis magnetic field, operably coupled to a first side of each of the plurality of magnetic-memory cells. The at least one logical data block may further include a plurality of hard-axis conductors configured for generating a hard-axis magnetic field operably coupled to a second side of each of the plurality of magnetic memory cells.

According to further embodiments of a magnetic memory module, the easy-axis conductor may be a row conductor, a column conductor, a write line or a bit line. According to other embodiments of a magnetic memory module, the plurality of hard-axis conductors may be row conductors, column conductors, write lines or bit lines.

Figure 4:
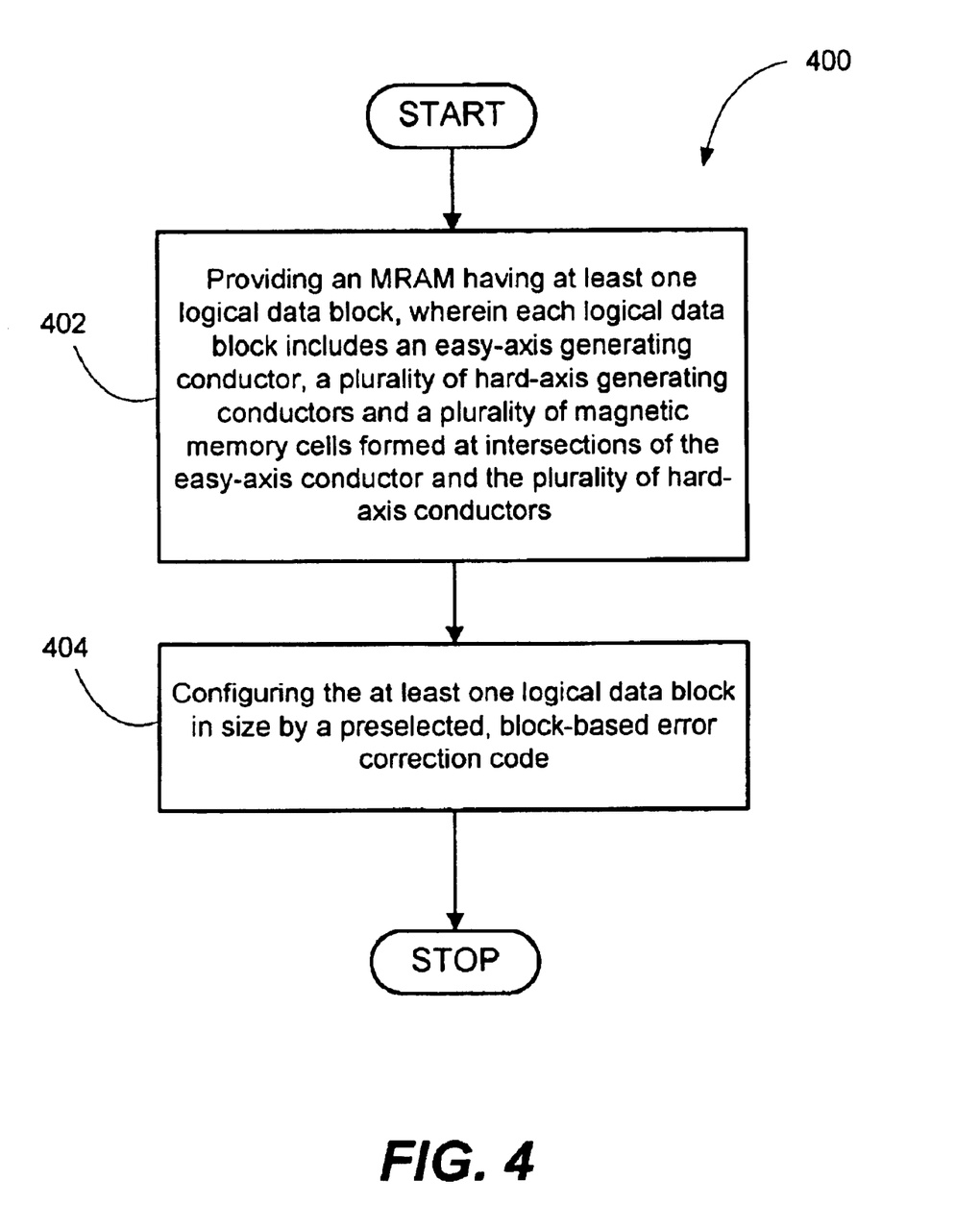
FIG. 4 is a flow chart of an embodiment of a method of reducing half-select write errors within a MRAM according to the present invention.

FIG. 4 is a flow chart of an embodiment of a method 400 of reducing half-select write errors within a MRAM according to the present invention. Method 400 may include providing 402 an MRAM having at least one logical data block, wherein each logical data block includes an easy-axis generating conductor, a plurality of hard-axis generating conductors and a plurality of magnetic memory cells formed at intersections of the easy-axis conductor and the plurality of hard-axis conductors. Method 400 may further include configuring 404 the at least one logical data block in size by a preselected, block-based error correction code. According to another embodiment of method 400, configuring the at least one logical data block in size by a preselected, block-based error correction code may include preselecting at least one of Bose-Chaudhuri-Hochquenghem (BCH) code, Reed-Solomon code and run length limited (RLL) code.

Figure 5:
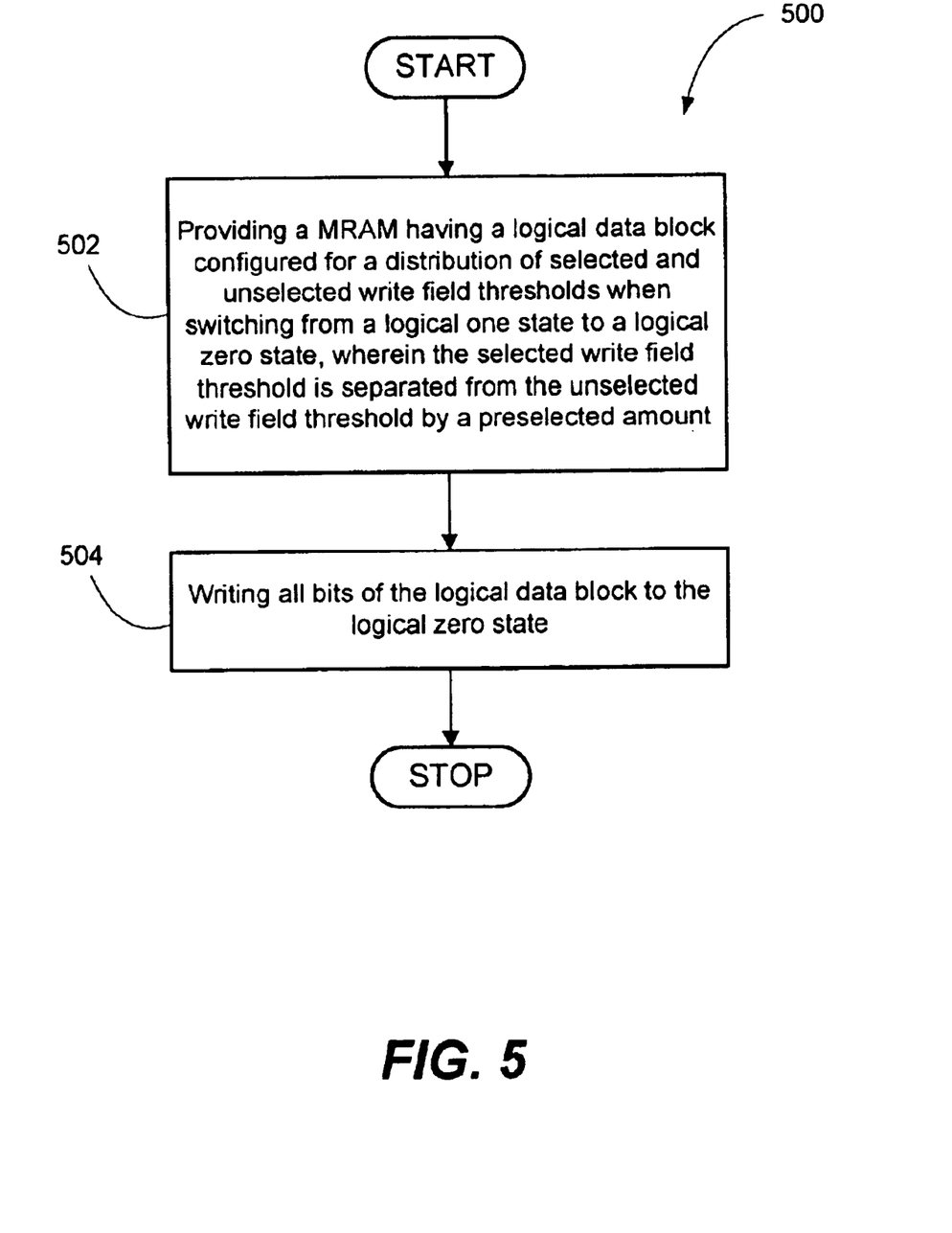
FIG. 5 is a flow chart of an embodiment of a method of erasing a logical data block of a MRAM according to the present invention.

FIG. 5 is a flow chart of an embodiment of a method 500 of erasing a logical data block of a MRAM according to the present invention. Method 500 may include providing 502 a MRAM having a logical data block configured for a distribution of selected and unselected write field thresholds when switching from a logical one state to a logical zero state, wherein the selected write field threshold is separated from the unselected write field threshold by a preselected amount and writing 504 all bits of the logical data block to the logical one state. The logical data block according to another embodiment of method 500 may further include a plurality of magnetic memory cells. The logical data block may further include an easy-axis conductor configured for generating an easy-axis magnetic field, operably coupled to a first side of each of the plurality of magnetic memory cells. The logical data block may further include a plurality of hard-axis conductors configured for generating a hard-axis magnetic field operably coupled to a second side of each of the plurality of magnetic memory cells. Writing 504 all bits of the logical data block to the logical one state may be achieved using only easy-axis current according to another embodiment of method 500.

The preselected amount may provide fewer bit errors than the maximum number of bit errors that is correctable by a preselected, block-based error correction code according to another embodiment consistent with the present invention. The preselected error correction code may be Bose-Chaudhuri-Hochquenghem (BCH) code, Reed-Solomon code, run length limited (RLL) code, or any other suitable error correction code. The preselected amount may be a predetermined number of standard deviations difference from a mean of the unselected write field distribution to a maximum switching field in an easy-axis magnetic field.

In order to avoid half-select errors, the probability distributions of the selected bits or memory cells (i.e., a fixed amount of hard-axis field is applied) and the unselected bits or memory cells (i.e., hard-axis field is set to zero) curves are preferably separated by a large statistical difference or "preselected amount." The following example will be used to illustrate an example of a preselected amount corresponding to a large statistical difference. The distributions of the selected bits and the unselected bits are assumed to be approximately normal distributions having standard deviation, σ. Suppose a magnetic memory sector has 2048 easy-axis generating row conductors and 5120 hard-axis generating column conductors. In this configuration, 2048× 5120=10.5×10$^6$ bits are exposed to half-select with each sector access. If a preselected error correction code was capable of correcting up to 105 inadvertently flipped bits among the 10.5×10$^6$ bits, then the preselected amount of separation from a mean of the unselected write field distribution to a maximum switching field in an easy-axis magnetic field must be about 4.2 standard deviations or greater. Of course, for some other error correcting code and/or some other size of a magnetic memory sector, the preselected amount may be some other number of standard deviations. One of ordinary skill in the art will be able to determine the proper preselected amount and, thus, will not be further elaborated on herein.

Figure 6:
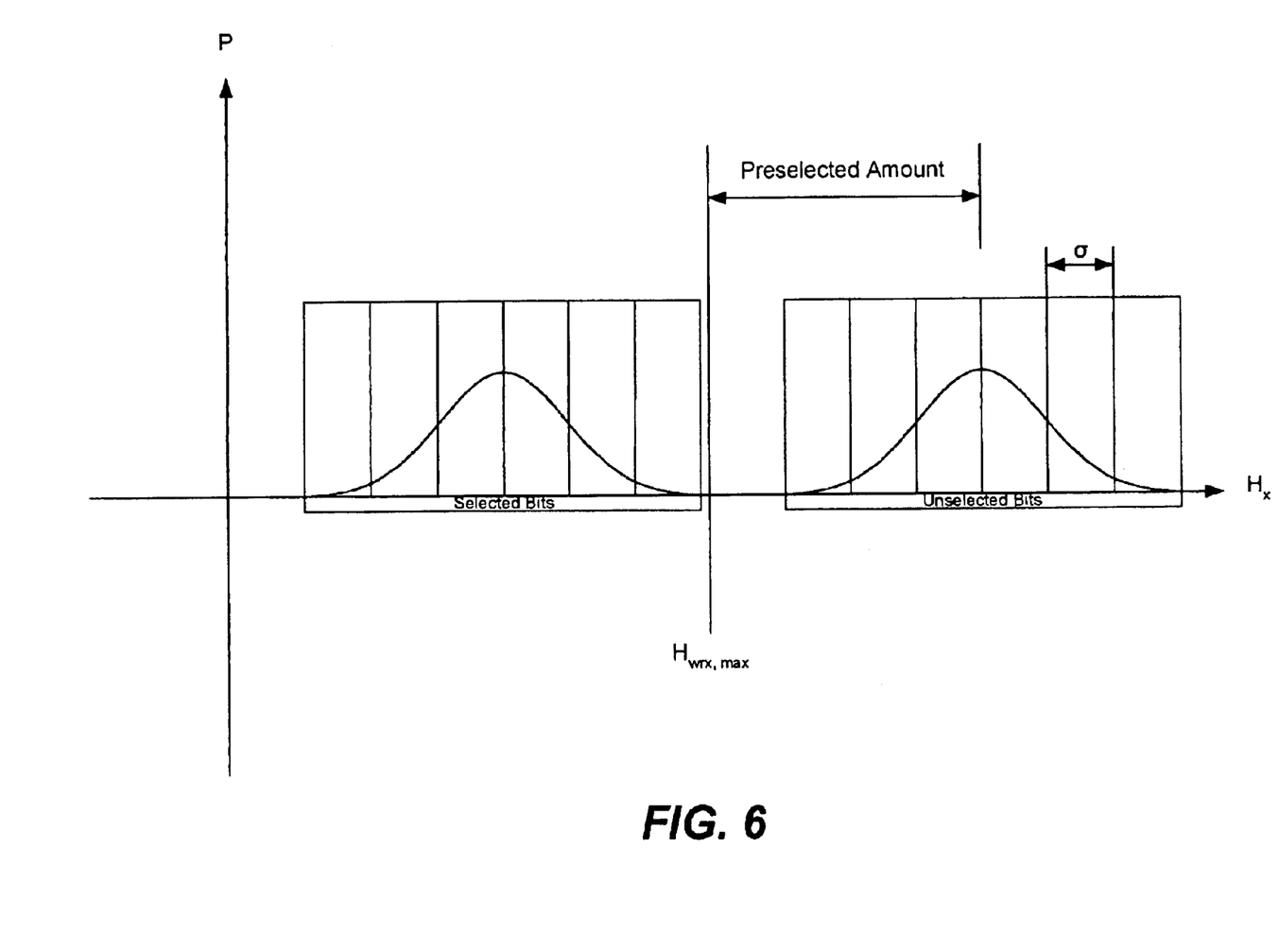
FIG. 6 illustrates a graph of probability distributions for selected and unselected bits for a write operation where a magnetic memory cell is switched from a "0" to a "1" state according to an embodiment of the present invention.

FIG. 6 illustrates a graph of probability distributions for selected and unselected bits for a write operation where a magnetic memory cell is switched from a "0" to a "1" state according to an embodiment of the present invention. FIG. 6 also illustrates a maximum switching field, $H_{wrx,max}$, associated with a maximum write current along an easy-axis magnetic field, $H_x$. FIG. 6 also illustrates a separation between the mean of the unselected write field threshold and the maximum switching field, $H_{wrx,max}$. The preselected amount may be measured by any suitable means, for example and not by way of limitation, a predetermined number of standard deviations.

Figure 7:
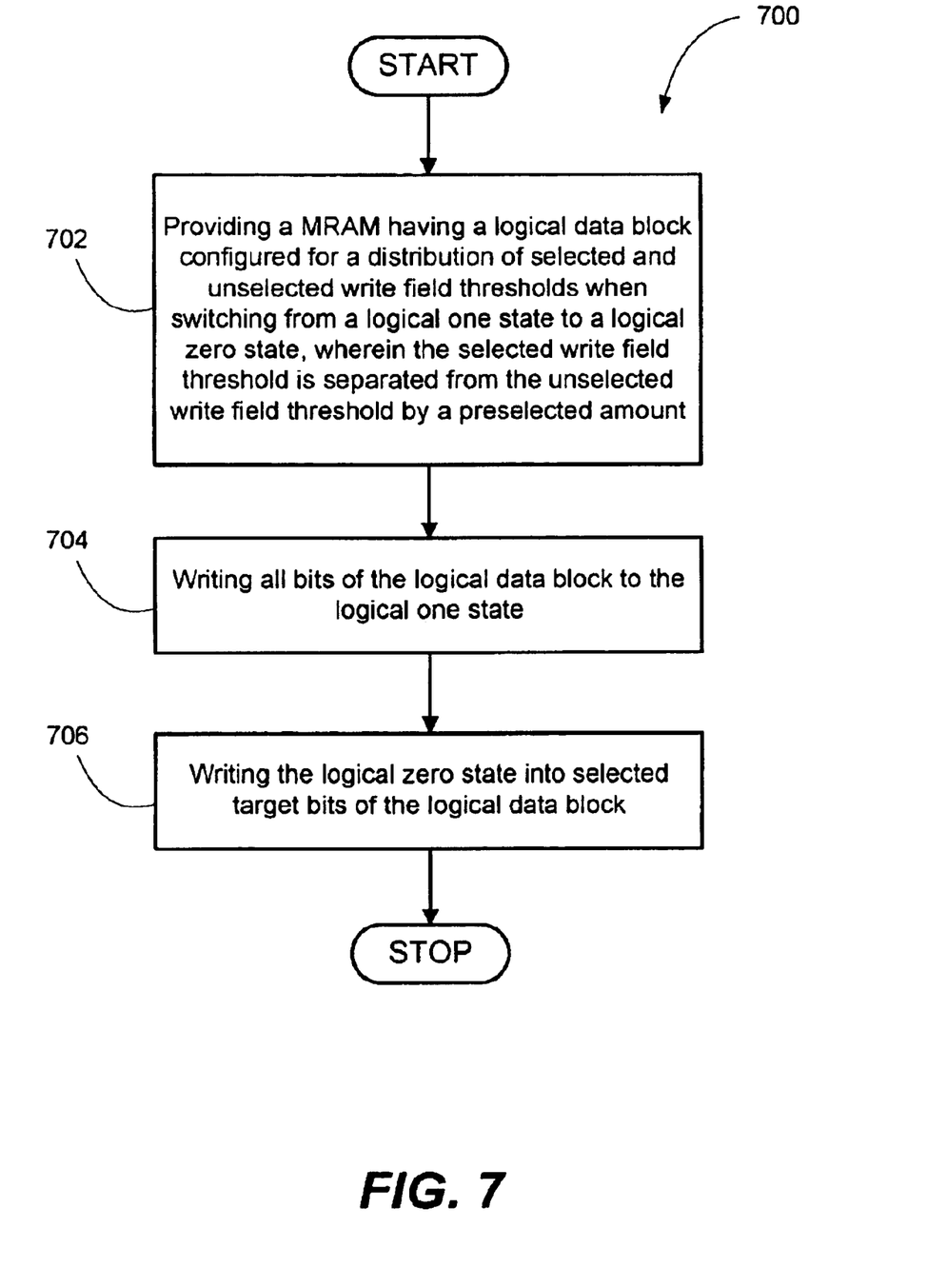
FIG. 7 illustrates a flow chart of a method embodiment of writing a logical data block of a MRAM in accordance with the present invention.

FIG. 7 illustrates a flow chart of a method 700 embodiment of writing a logical data block of a MRAM in accordance with the present invention. Referring to FIGS. 6 and 7, method 700 may include providing 702 a MRAM having a logical data block configured for a distribution of selected and unselected write field thresholds when switching from a logical one state to a logical zero state, wherein the selected write field threshold is separated from the unselected write field threshold by a preselected amount. The preselected amount may provide fewer bit errors than the maximum number of bit errors that is correctable by a preselected error correction code according to another embodiment consistent with the present invention. The preselected amount may be a predetermined number of standard deviations, difference from a mean of the unselected write field distribution to a maximum switching field in an easy-axis magnetic field.

Method 700 may also include writing 704 all bits of the logical data block to the logical one state and writing 706 the logical zero state into selected target bits of the logical data block. According to another embodiment of method 700, the logical data block may further include a plurality of magnetic memory cells. The logical data block may further include an easy-axis conductor configured for generating an easy-axis magnetic field, operably coupled to a first side of each of the plurality of magnetic memory cells. The logical data block may further include a plurality of hard-axis conductors configured for generating a hard-axis magnetic field operably coupled to a second side of each of the plurality of magnetic memory cells. An exemplary embodiment of method 700 may include writing 704 a logical one state to all bits of the logical data block and writing 706 the logic zero state to selected target bits, each operation taking 2 μs. Thus for example and not by way of limitation, a write cycle under the above exemplary embodiment of method 700 would take approximately 4 μs.

Figure 8:
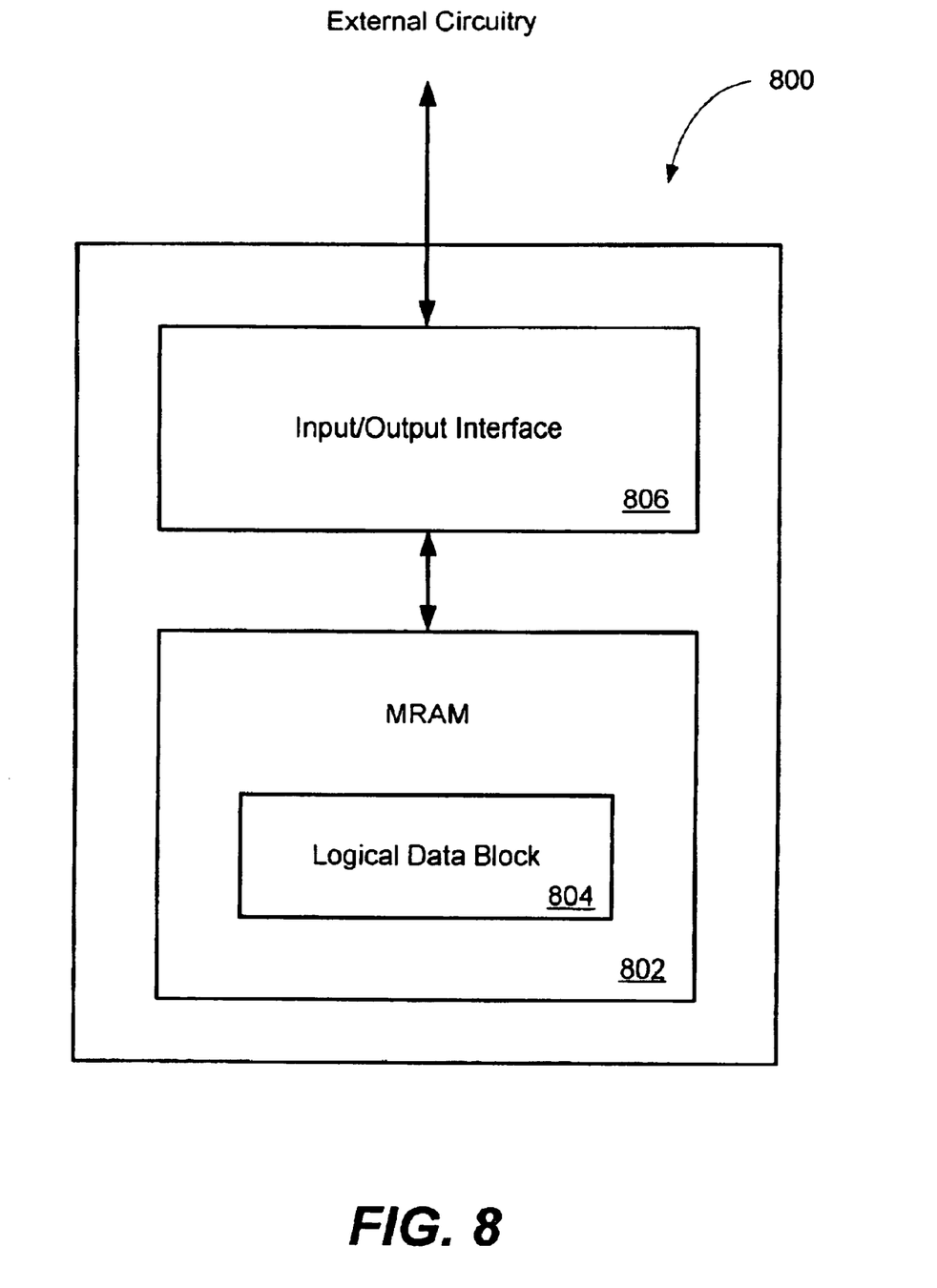
FIG. 8 is a block diagram of a magnetic memory module in accordance with an embodiment of the present invention.

FIG. 8 is a block diagram of a magnetic memory module 800 in accordance with an embodiment of the present invention. Magnetic memory module 800 may include at least one MRAM 802 comprising at least one logical data block 804 configured for a distribution of selected and unselected write field thresholds when switching from a logical one state to a logical zero state, wherein the selected write field threshold is separated from the unselected write field threshold by a preselected amount. Magnetic memory module 800 may further include an input/output interface 806 in communication with the at least one MRAM 802 for communicating with external circuitry. Magnetic memory module 800 may take the form of a single inline memory module (SIMM), dual inline memory module (DIMM), or any other memory module suitable for use with external circuitry. In yet another embodiment according to the present invention, magnetic memory module 800 may be incorporated in an application specific integrated circuit (ASIC) with other control and logic circuitry.

According to another embodiment of the present invention, the at least one logical data block 804 may include a plurality of magnetic memory cells, an easy-axis conductor configured for generating an easy-axis magnetic field, operably coupled to a first side of each of the plurality of magnetic memory cells and a plurality of hard-axis conductors configured for generating a hard-axis magnetic field operably coupled to a second side of each of the plurality of magnetic memory cells.

Figure 9:
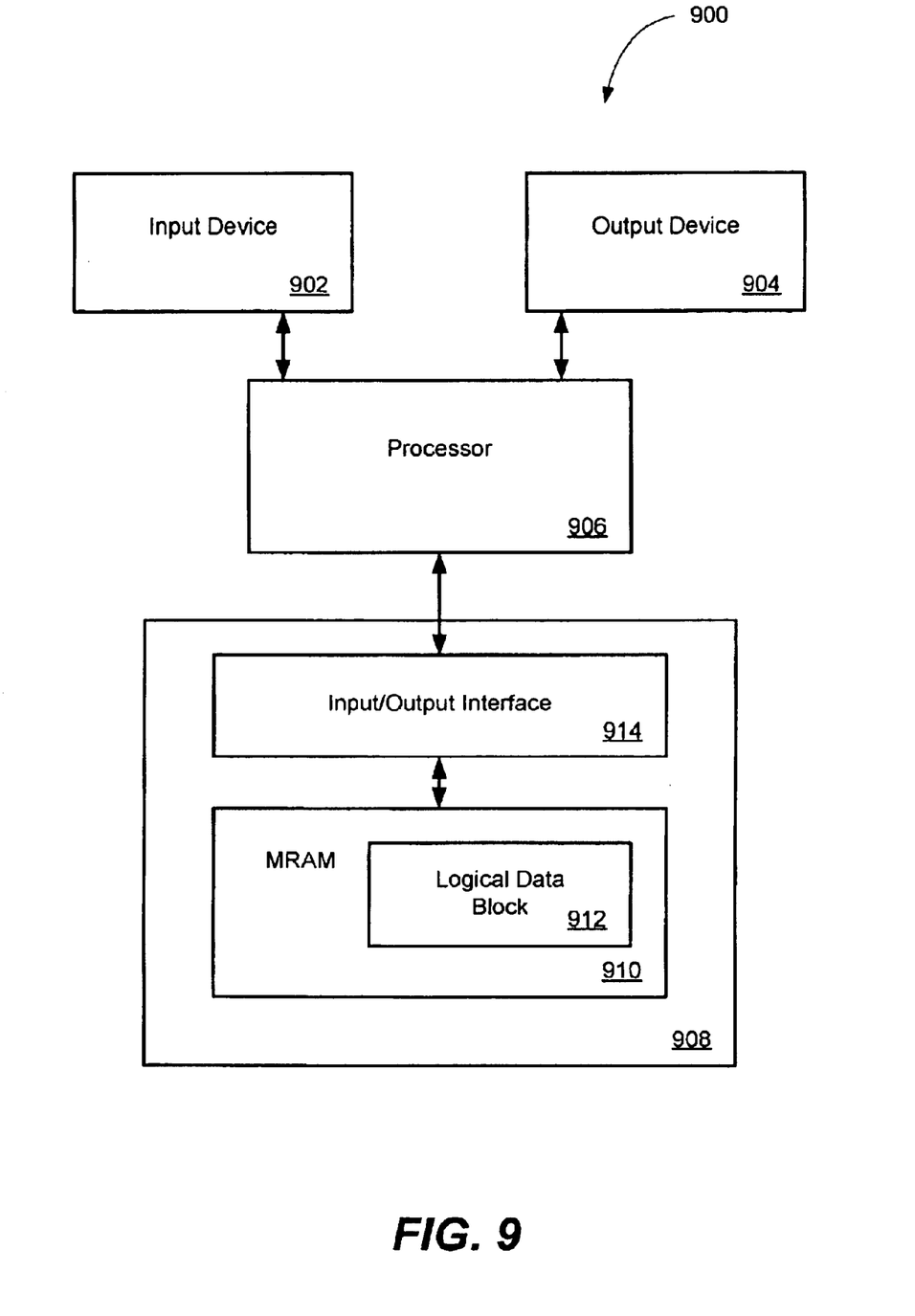
FIG. 9 is a block diagram of a computer system in accordance with an embodiment of the present invention.

FIG. 9 is a block diagram of a computer system 900 in accordance with an embodiment of the present invention. Computer system 900 may include an input device 902, an output device 904 and a processor 906 operably coupled to the input device 902 and the output device 904. Computer system 900 may further include a memory device 908 operably coupled to the processor 906. The memory device 908 may include at least one MRAM 910 comprising at least one logical data block 912 configured for a distribution of selected and unselected write field thresholds when switching from a logical one state to a logical zero state, wherein the selected write field threshold is separated from the unselected write field threshold by a preselected amount. The memory device 908 may further include an input/output interface 914 in communication with the at least one MRAM 910 for communicating the processor 906. The at least one logical data block 912 may be configured as described for logical data block 804 above and elsewhere herein.

Figure 10:
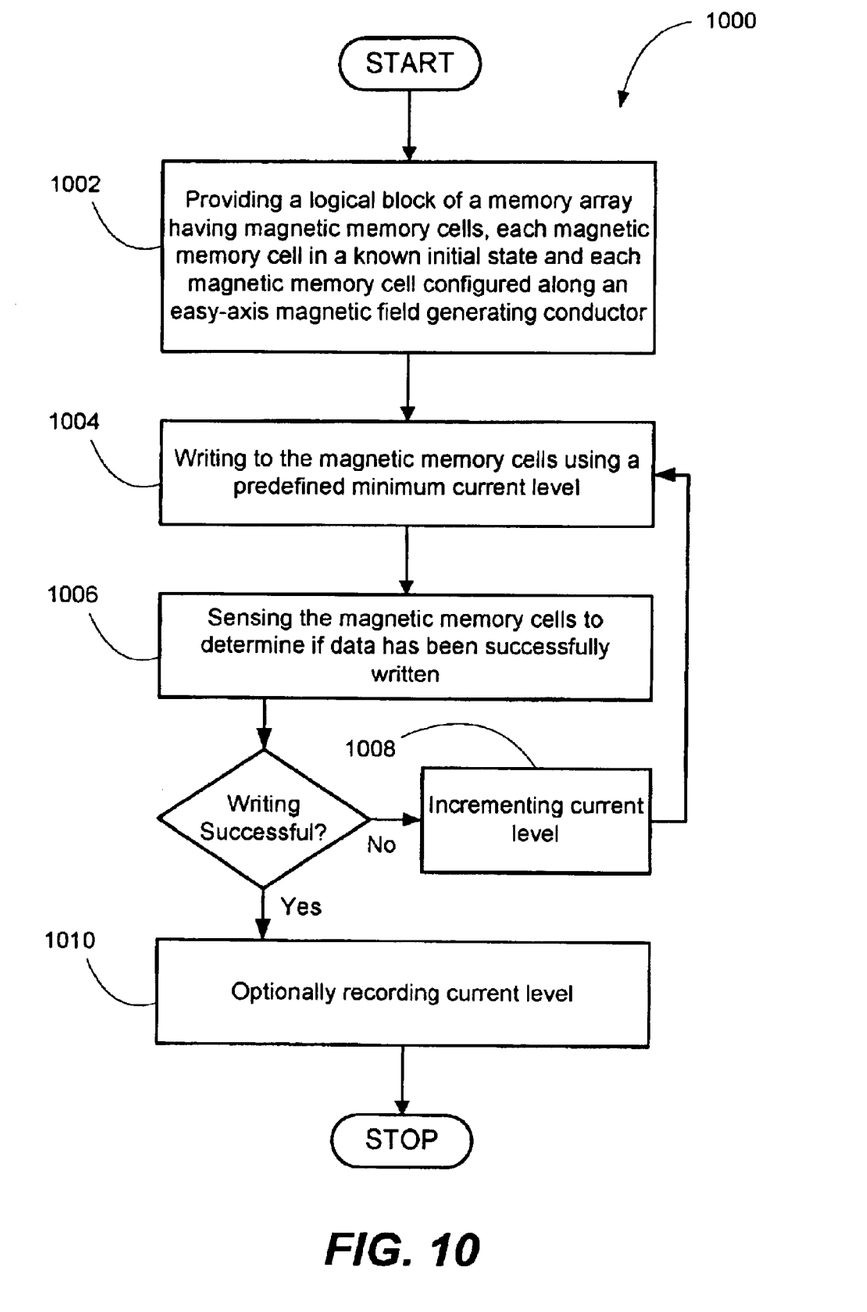
FIG. 10 is a flow chart of a method of adaptively writing magnetic memory cells of a MRAM according to another embodiment of the present invention.

FIG. 10 is a flow chart of a method 1000 of adaptively writing magnetic memory cells of a MRAM according to another embodiment of the present invention. Method 1000 may include providing 1002 a logical data block of a memory array having magnetic memory cells, each magnetic memory cell in a known initial state and each magnetic memory cell configured along an easy-axis magnetic field generating conductor. Method 1000 may further include writing 1004 to the magnetic memory cells using a predefined minimum current level and sensing 1006 the magnetic memory cells to determine if data has been successfully written. Method 1000 may further include incrementing 1008 the current level if writing was unsuccessful and repeating writing 1004 and sensing 1006 above. Method 1000 may further include recording 1010 current level for future writing if the writing was successful. Providing 1002 a logical data block of a memory array having magnetic memory cells, each magnetic memory cell in a known initial state may be obtained by writing the known initial state into every magnetic memory cell in the memory array.

A two-stage adaptive write embodiment of method 1000 may include writing the logical one state into every magnetic memory cell in the memory array for 2 $\mu$s, settling the memory array for 2 $\mu$s, sensing bits for 16 $\mu$s, writing the logical zero state into target bits for 2 $\mu$s, settling the memory array for 2 $\mu$s, sensing bits for 16 $\mu$s, incrementing the current level and writing non-flipped target bits for 2 $\mu$s, settling the memory array for 2 $\mu$s and sensing the bits for 16 $\mu$s. The two-stage adaptive write embodiment of method 1000 would have a write cycle of approximately 60 $\mu$s. A four-stage adaptive write embodiment of method 1000 may include performing the two-stage adaptive write twice thus allowing for three increments of the current level.

Method 1000 allows fine tuning of the write current level used in a MRAM by adaptively determining the minimum write current sufficient to write all of the magnetic memory cells in a given logical data block. The logical data block may have any suitable number of magnetic memory cells according to embodiments of the present invention. For example, and not by way of limitation, a logical data block may have more magnetic memory cells configured along the easy-axis magnetic field generating conductor than along hard-axis conductors according to an embodiment of the present invention. Each of the magnetic memory cells may be in a known initial state by writing the known initial state into each of the magnetic memory cells in the logical data block. The known initial state may be either the logical one state or the logical zero state. Writing the known initial state into each of the magnetic memory cells in the logical data block may be achieved by using only easy-axis write current according to another embodiment of method 1000.

According to another embodiment of method 1000, writing 1004 to the magnetic memory cells using the predefined minimum current level may include applying a fixed write current to the easy-axis magnetic field generating conductor and applying the predefined minimum current level to hard-axis magnetic field generating conductors. Writing 1004 may further include configuring intersections of the easy-axis magnetic field generating conductor and the hard-axis magnetic field generating conductors as the magnetic memory cells.

According to another embodiment of method 1000, sensing 1006 the magnetic memory cells to determine if data has been successfully written may further include comparing states of the magnetic memory cells to the known initial state and determining if the states of the magnetic memory cells are opposite the known initial state, wherein the data has been successfully written or determining if the states of the magnetic memory cells are the same as the known initial state, wherein the data has not been successfully written.

Figure 11:
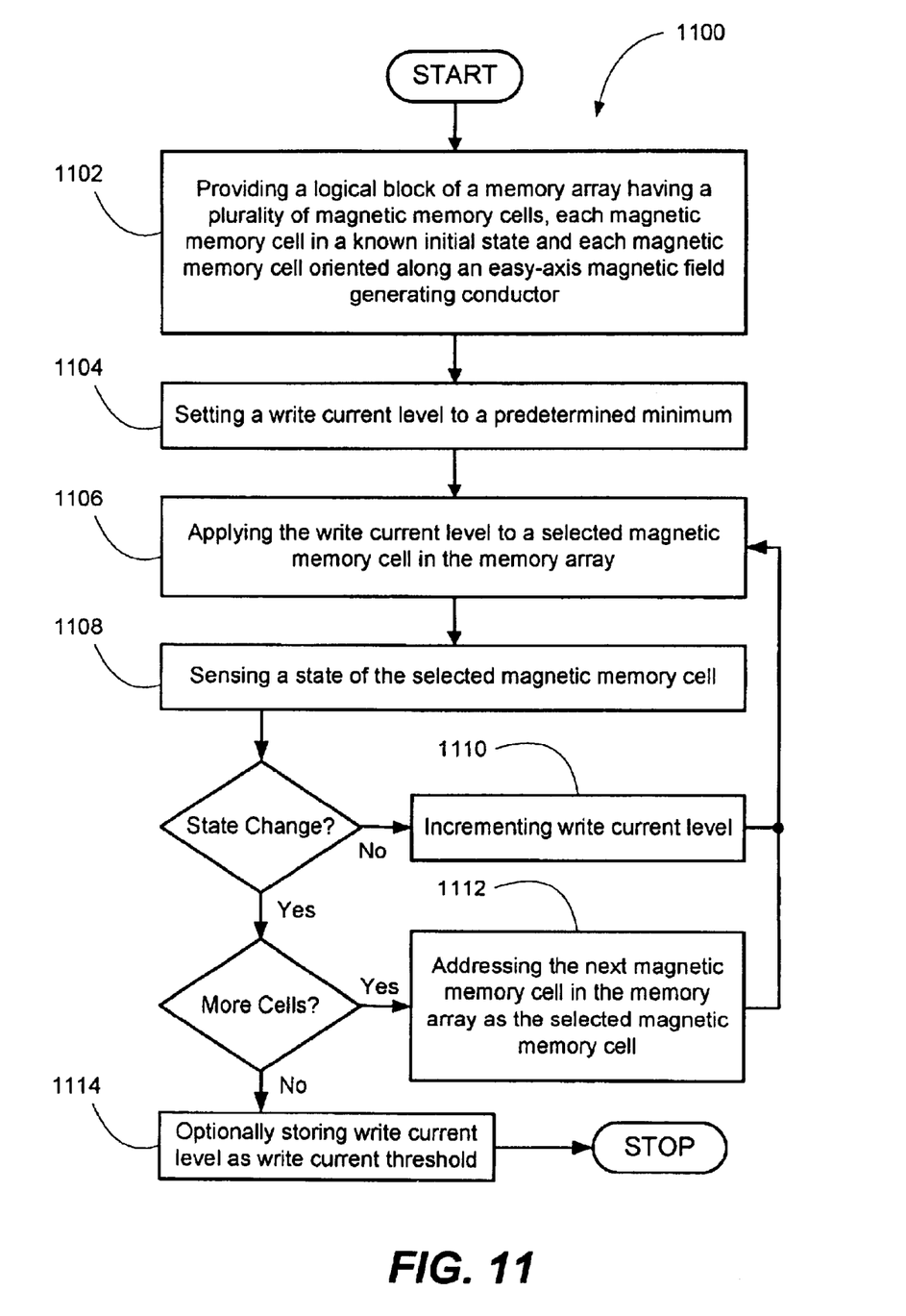
FIG. 11 is a flow chart of an embodiment of a method of adaptively determining a write current threshold for writing magnetic memory cells of a logical data block of a MRAM according to the present invention.

FIG. 11 is a flow chart of an embodiment of a method 1100 of adaptively determining a write current threshold for writing magnetic memory cells of a logical data block of a MRAM according to the present invention. Method 1100 may include providing 1102 a logical data block of a memory array having a plurality of magnetic memory cells, each magnetic memory cell in a known initial state and each magnetic memory cell oriented along an easy-axis magnetic field generating conductor. Method 1109 may further include setting 1104 a write current level to a predetermined minimum and applying 1106 the write current level to a selected magnetic memory cell in the memory array. Method 100 may further include sensing 1108 a state of the selected magnetic memory cell and incrementing 1110 the write current level and repeating if the state of the selected magnetic memory cell remains in the known initial state. Method 1100 may further include addressing 1112 the next magnetic memory cell in the memory array as the selected magnetic memory cell and repeating. Method 1100 may further include storing 1114 the write current level as a write current threshold for future writing if there are no more next magnetic, memory cells.

A logical data block may have any number of magnetic memory cells according to embodiments of the present invention. The logical data block may have more magnetic memory cells configured along the easy-axis magnetic field generating conductor than along hard-axis conductors according to another embodiment of the present invention. Applying 1106 the write current level to a selected magnetic memory cell in the memory array may include applying a fixed write current to the easy-axis magnetic field generating conductor and applying a predefined minimum write current level to a hard-axis magnetic field generating conductor. Applying 1106 the write current level to a selected magnetic memory cell in the memory array may further include configuring an intersection of the easy-axis magnetic field generating conductor and the hard-axis magnetic field generating conductor as the selected magnetic memory cell. Providing 1102 may include writing the known initial state into each of the plurality of magnetic memory cells in the logical data block using only easy-axis write current according to another embodiment of the present invention. The known initial state may be the logical one state or the logical zero state.

Figure 12:
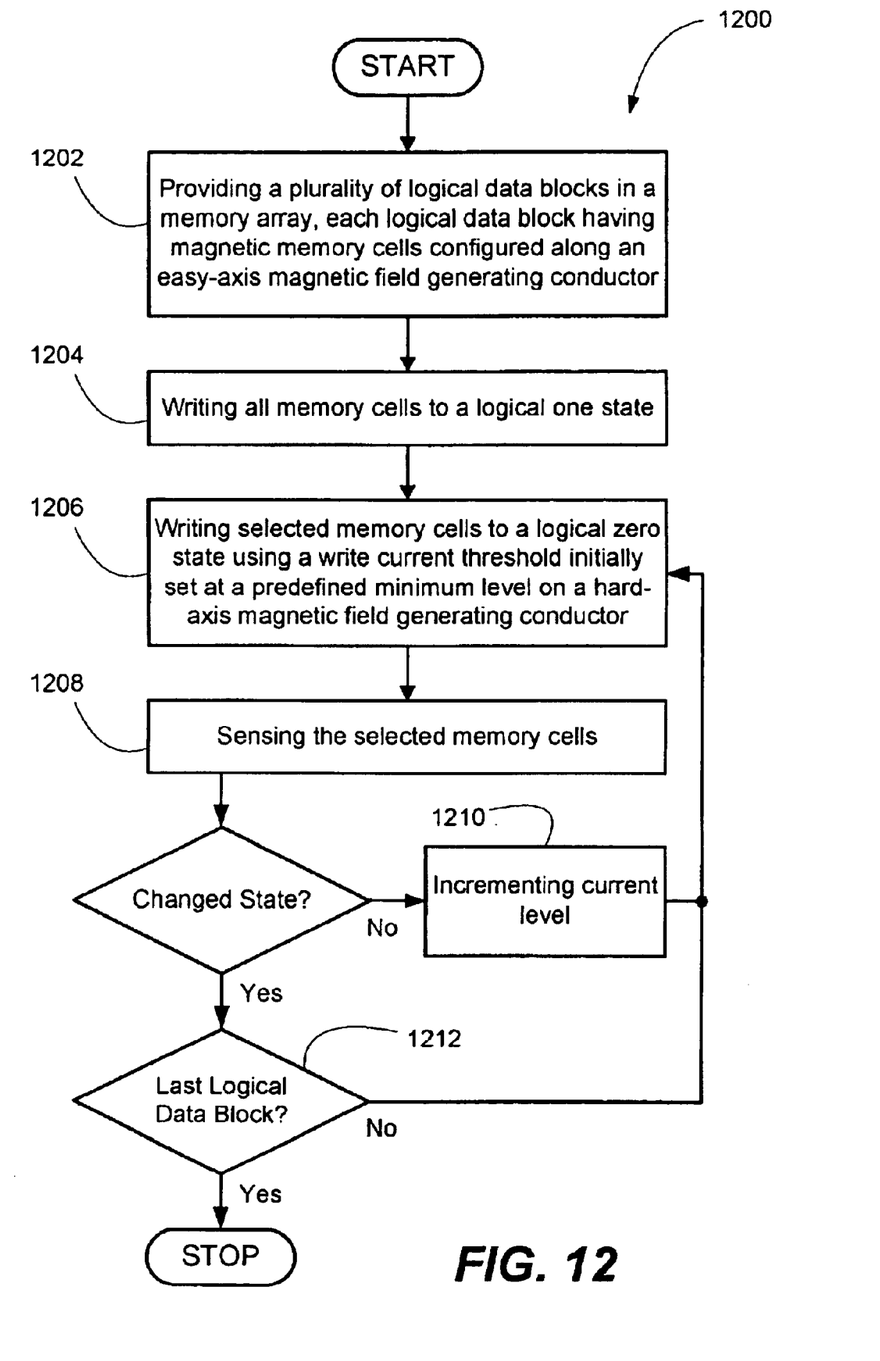
FIG. 12 is a flow chart of another method of adaptively writing magnetic memory cells of a MRAM according to another embodiment of the present invention.

FIG. 12 is a flow chart of another method 1200 of adaptively writing magnetic memory cells of a MRAM according to another embodiment of the present invention. Method 1200 may include providing 1202 a plurality of logical data blocks in a memory array, each logical data block having magnetic memory cells configured along an easy-axis magnetic field generating conductor and writing 1204 all memory cells to a logical one state. For each of the plurality of logical data blocks, method 1200 may further include writing 1206 selected memory cells to a logical zero state using a write current threshold initially set at a predefined minimum level on a hard-axis magnetic field generating conductor and sensing 1208 the selected memory cells. For each of the plurality of logical data blocks, method 1200 may further include incrementing 1210 the write current threshold if any of the selected memory cells failed to change to the logical zero state and repeating 1212 until all of the selected memory cells change to the logical zero state.

Method 1200 allows selective incrementing of the write current threshold level until that level is just capable of changing all selected memory cells to the logical zero state. Thus, optimal selection of a write current threshold level may be determined according to an embodiment of the present invention. According to another embodiment of the present invention, writing 1204 all memory cells to a logical one state may be achieved by the application of only an easy-axis write current of sufficient magnitude to reliably write all the bits in a logical data block. Thus, for this embodiment, no hard-axis current is required to write all memory cells to a logical one state.

Logical data blocks may be of any suitable size according to embodiments of the present invention. According to one embodiment of the present invention, logical data blocks may each have more magnetic memory cells configured along the easy-axis magnetic field generating conductor than along hard-axis conductors. According to another embodiment of method 1200, providing 1202 the plurality of logical data blocks may include providing a stack of substrates each substrate having a plurality of logical data blocks each logical data block having more magnetic memory cells configured along the easy-axis magnetic field generating conductor than along hard-axis conductors.

It is to be understood that the above-referenced arrangements are illustrative of the application for the principles of the present invention. Numerous modifications and alternative arrangements can be devised without departing from the spirit and scope of the present invention while the present invention has been shown in the drawings and described above in connection with the exemplary embodiments of the invention. It will be apparent to those of ordinary skill in the art that numerous modifications can be made without departing from the principles and concepts of the invention as set forth in the claims.

What is claimed is:

1. A method of adaptively writing magnetic memory cells of a magnetic random access memory (MRAM), the method comprising:

providing a logical data block of a memory array having magnetic memory cells, each magnetic memory cell in a known initial state and each magnetic memory cell configured along an easy-axis magnetic field generating conductor;

writing to the magnetic memory cells using a predefined minimum current level;

sensing the magnetic memory cells to determine if data has been successfully written; and incrementing the current level if writing was unsuccessful and repeating the steps of writing to the magnetic memory and sensing the magnetic memory.

2. The method according to claim 1, further comprising recording current level for future writing if writing was successful.

3. The method according to claim 1, wherein providing the logical data block comprises providing a logical data block having more magnetic memory cells configured along the easy-axis magnetic field generating conductor than along hard-axis conductors.

4. The method according to claim 1, wherein providing the logical data block of the memory array having the magnetic memory cells, each magnetic memory cell in a known initial state, comprises writing the known initial state into each of the plurality of magnetic memory cells in the logical data block using only easy-axis write current.

5. The method according to claim 4, wherein the known initial state comprises a logical one state.

6. The method according to claim 1, wherein writing to the magnetic memory cells using the predefined minimum current level comprises:

applying a fixed write current to the easy-axis magnetic field generating conductor;

applying the predefined minimum current level to hard-axis magnetic field generating conductors; and configuring intersections of the easy-axis magnetic field generating conductor and the hard-axis magnetic field generating conductors as the magnetic memory cells.

7. The method according to claim 1, wherein sensing the magnetic memory cells to determine if data has been successfully written comprises:

comparing states of the magnetic memory cells to the known initial state;

determining if the states of the magnetic memory cells are opposite the known initial state, wherein the data has been successfully written; or determining if the states of the magnetic memory cells are the same as the known initial state, wherein the data has not been successfully written.

8. A method of determining a write current threshold for writing magnetic memory-cells of a logical data block of a magnetic random access memory (MRAM), the method comprising:

providing a logical data block of a memory array having a plurality of magnetic memory cells, each magnetic memory cell in a known initial state and each magnetic memory cell oriented along an easy-axis magnetic field generating conductor;

setting a write current level to a first value;

applying the write current level at the first value to a selected magnetic memory cell in the memory array;

sensing a state of the selected magnetic memory cell;

incrementing the write current level from the first value to a second value higher than the first value; and repeating the step of applying the write current level if the state of the selected magnetic memory cell remains in the known initial state.

9. The method according to claim 8, further comprising addressing another magnetic memory cell in the memory array as the selected magnetic memory cell and repeating the method according to claim 8.

10. The method according to claim 9, further comprising storing a final value as a write current threshold for future writing if there are no remaining magnetic memory cells.

11. The method according to claim 8, wherein applying the write current level to a selected magnetic memory cell in the memory array comprises:
- applying a fixed write current to the easy-axis magnetic field generating conductor;
- applying the write current level to a hard-axis magnetic field generating conductor, and
- configuring an intersection of the easy-axis magnetic field generating conductor and the hard-axis magnetic field generating conductor as the selected magnetic memory cell.

12. A method of writing magnetic memory cells of a magnetic random access memory (MRAM), the method comprising:
- determining a write current threshold for writing the magnetic memory cells of the MRAM;
- addressing selected magnetic memory cells of the MRAM; and
- writing the selected magnetic memory cells using the write current threshold.

13. The method according to claim 12, wherein determining a write current threshold, comprises:
- providing a logical data block of a memory array having a plurality of magnetic memory cells, each magnetic memory cell in a known initial state and each magnetic memory cell configured along an easy-axis magnetic field generating conductor;
- setting a write current level to a predetermined minimum;
- applying the write current level to a selected magnetic memory cell in the memory array;
- sensing a state of the selected magnetic memory cell;
- incrementing the write current level and repeating above if the state of the selected magnetic memory cell remains in the known initial state; or
- addressing the next magnetic memory cell in the memory array as the selected magnetic memory cell and repeating above.

14. A method for writing magnetic memory cells of a magnetic random access memory (MRAM), the method comprising:
- providing a plurality of logical data blocks in a memory array, each logical data block having magnetic memory cells configured along an easy-axis magnetic field generating conductor;
- writing all memory cells to a logical one state;
- for each of the plurality of logical data blocks:
  - (a) writing selected memory cells to a logical zero state using a write current threshold initially set at a predefined minimum level on a hard-axis magnetic field generating conductor,
  - (b) sensing the selected memory cells;
  - (c) incrementing the write current threshold if any of the selected memory cells failed to change to the logical zero state; and
  - (d) repeating (a) through (c) above until all of the selected memory cells change to the logical zero state.

15. The method of claim 14, wherein writing all memory cells to a logical one state comprises writing the logical one state using only easy-axis write current.

16. The method of claim 14, wherein providing the plurality of logical data blocks comprises providing a plurality of logical data blocks each having a size selected according to a preselected, block-based error correction code.

17. The method of claim 16, wherein the preselected, block-based error correction code comprises Bose-Chaudhuri-Hochquenghem (BCH) code.

18. The method of claim 16, wherein the preselected, block-based error correction code comprises Reed-Solomon code.

19. The method of claim 16, wherein the preselected, block-based error correction code comprises run length limited (RLL) code.

* * * * *